United States Patent
Aggrawal et al.

(10) Patent No.: US 10,204,697 B2
(45) Date of Patent: Feb. 12, 2019

(54) IMPULSE SAMPLER ARCHITECTURE AND ACTIVE CLOCK CANCELLATION ARCHITECTURE

(71) Applicants: Himanshu Aggrawal, Agra (IN); Aydin Babakhani, Houston, TX (US)

(72) Inventors: Himanshu Aggrawal, Agra (IN); Aydin Babakhani, Houston, TX (US)

(73) Assignee: WILLIAM MARSH RICE UNIVERSITY, Houston, TX (US)

( * ) Notice: Subject to any disclaimer, the term of this patent is extended or adjusted under 35 U.S.C. 154(b) by 0 days.

(21) Appl. No.: 15/442,638

(22) Filed: Feb. 25, 2017

(65) Prior Publication Data

US 2017/0250793 A1 Aug. 31, 2017

Related U.S. Application Data

(60) Provisional application No. 62/299,675, filed on Feb. 25, 2016.

(51) Int. Cl.
*G11C 27/02* (2006.01)
*G01R 25/00* (2006.01)

(52) U.S. Cl.
CPC ............ *G11C 27/026* (2013.01); *G01R 25/00* (2013.01)

(58) Field of Classification Search
CPC ............... H03K 17/16; H03K 19/0013; H03K 19/00346; H03K 19/00361; H03K 5/249; H03K 17/063; H03K 17/687; H03K 5/2427; H03M 1/1245; H03D 7/1441; H03D 1/18; H03D 7/12; H04B 1/0025; H04B 1/28

See application file for complete search history.

(56) References Cited

U.S. PATENT DOCUMENTS 3,917,963 A * 11/1975 Wadlington ......... H03K 17/601
 327/482
6,009,317 A 12/1999 Wynn
(Continued)

FOREIGN PATENT DOCUMENTS

WO WO-2015105546 A2 7/2015
WO WO-2016187300 A1 11/2016

OTHER PUBLICATIONS

International Search Report and Written Opinion for PCT/US16/33077, dated Aug. 23, 2016.
(Continued)

*Primary Examiner* — Khanh C Tran
(74) *Attorney, Agent, or Firm* — Winstead PC

(57) ABSTRACT

A novel nonlinear impulse sampler is presented that provides a clock sharpening circuit, sampling stage, and post-sampling block. The clock sharpening circuit sharpens the incoming clock while acting as a buffer, and the sharpened clock is fed to the input of the sampling stage. The impulse sampling stage has two main transistors, where one transistor generates the impulse and the other transistor samples the input signal. Post-sampling block processes the sampled signal and acts as a sample and hold circuit. The architecture uses an ultrafast transmission-line based inductive peaking technique to turn on a high-speed sampling bipolar transistor for a few picoseconds. It is shown that the sampler can detect impulses as short as 100 psec or less.

22 Claims, 9 Drawing Sheets

(56) References Cited

U.S. PATENT DOCUMENTS

| | | | |
|---|---|---|---|
| 8,698,532 B2* | 4/2014 | Raghavan | H03K 3/356043 327/108 |
| 9,246,505 B2 | 1/2016 | Aggrawal et al. | |
| 2009/0213770 A1 | 8/2009 | Mu | |
| 2012/0038390 A1* | 2/2012 | Raghavan | H03K 3/012 327/94 |
| 2014/0091802 A1 | 4/2014 | Yang et al. | |
| 2015/0229319 A1 | 8/2015 | Aggrawal et al. | |
| 2016/0223669 A1 | 8/2016 | Assefzadeh et al. | |
| 2016/0344108 A1 | 11/2016 | Assefzadeh et al. | |
| 2017/0098475 A1* | 4/2017 | Hidri | G11C 27/02 |
| 2017/0230054 A1* | 8/2017 | Francis | H03M 1/001 |

OTHER PUBLICATIONS

Shahramian, S, et al., "A 30-GS/sec Track and Hold Amplifier in 0.13-?m CMOS Technology", IEEE, Custom Integrated Circuits Conference (CICC), pp. 493-496 (2006).

I. Jaesik Lee, et al., "A 50GS/s Distributed T/H Amplifier in 0.18?m SiGe BiCMOS", IEEE Solid-State Circuits Conference (ISSCC), pp. 466-616 (2007).

Babakhani, A, et al., "Transmitter Architectures Based on Near-Field Direct Antenna Modulation (NFDAM)", IEEE Transactions on Wireless Communications, vol. 43 (2009).

Babakhani, A, et al., "Near-Field Direct Antenna Modulation", IEEE Microwave Magazine, vol. 10, No. 5 (2010).

Urazghildiiev, I, et al., "High-Resolution Estimation of Ranges Using Multiple-Frequency CW Radar", IEEE Transactions on Intelligent Transportation Systems, vol. 8 (2007).

Zhao, P, et al., "A 24GHz Pulse-Mode Transmitter for Short-Range Car Radar", IEEE Symposium on Radio Frequency Integrated Circuits (RFIC) (2007).

Millet, N, et al., "Passive radar air surveillance: Last results with multireceiver systems", International Proceedings on Radar Symposium (2011).

P. Chen and A. Babakhani, "A 30GHz Impulse Radiator with On-Chip Antennas for High-Resolution 3D Imaging," IEEE Radio and Wireless Symp. (RWS), San Diego, CA, Jan. 2015.

Ziegler, V.; Schubert, F.; Schulte, B.; Giere, A.; Koerber, R.; Waanders, T., "Miniaturized helicopter near field obstacle warning radar: Sensor system performance and flight tests," Microwave Symposium (IMS), 2014 IEEE MTT-S International , vol., No., pp. 1,4, Jun. 1-6, 2014.

D. Grischkowsky, "Unique applications of thz time-domain spectroscopy and waveguide thz-tds," in Infrared and Millimeter Waves, 2007 and the 2007 15th International Conference on Terahertz Electronics. IRMMWTHz. Joint 32nd International Conference on, 2007.

M. Assefzadeh and A. Babakhani, "An 8-psec 13dBm peak EIRP digitalto-impulse radiator with an on-chip slot bow-tie antenna in silicon," in IEEE MTT-S International Microwave Symposium (IMS), 2014.

L. Kull, T. Toifl, M. Schmatz, P. Francese, C. Menolfi, M. Braendli, M. Kossel, T. Morf, T. Andersen, and Y. Leblebici, "22.1 a 90gs/s 8b 667mw 64x interleaved sar adc in 32nm digital soi cmos," in Solid-State Circuits Conference Digest of Technical Papers (ISSCC), 2014 IEEE International, 2014.

Y. Bouvier, A. Konczykowska, A. Ouslimani, and J. Godin, "A 1gsample/s, 15 ghz input bandwidth master-slave track-and-hold amplifier in inp-dhbt technology," in Microwave Symposium Digest, 2009. MTT '09. IEEE MTT-S International, 2009.

A. Abo and P. Gray, "A 1.5-v, 10-bit, 14.3-ms/s cmos pipeline analogto-digital converter," Solid-State Circuits, IEEE Journal of, 1999.

H. Aggrawal and A. Babakhani, "A 40GS/s Track-and-Hold amplifier with 62dB SFDR3 in 45nm CMOS SOI," in IEEE IMS, 2014.

H. Aggrawal, P. Chen, M. M. Assefzadeh, B. Jamali, and A. Babakhani, "Gone in a picosecond: Techniques for the generation and detection of picosecond pulses and their applications," IEEE Microwave Magazine, vol. 17, No. 12, pp. 24-38, Dec 2016.

A. Buchwald, "High-speed time interleaved ADCs," IEEE Communications Magazine, vol. 54, No. 4, pp. 71-77, Apr. 2016.

T. Kikkawa, A. Toya, and X. Xiao, "Cmos equivalent time sampling circuit for breast cancer detection," in 2014 12th IEEE International Conference on Solid-State and Integrated Circuit Technology (ICSICT), Oct. 2014.

M. Strackx, E. D'Agostino, P. Leroux, and P. Reynaert, "A 6-b uwb subsampling track amp; hold with 5.5-ghz erbw in 40 nm cmos," in 2014 IEEE Radio Frequency Integrated Circuits Symposium, Jun. 2014.

X. Liu, S. Ma, M. Yan, J. Ren, and H. Yu, "A 5-gs/s, 13-mw, 2-channel time-interleaved asynchronous adc in 65nm cmos," in 2016 IEEE International Symposium on Radio-Frequency Integration Technology (RFIT), Aug. 2016.

Z. Yi, W. Shenjie, H. Zhiliang, and Z. Zaichen, "A sub-sampling 4.25gs/s 3-bit flash adc with asymmetric spatial filter response," in 2011 IEEE International Symposium on Radio-Frequency Integration Technology, Nov. 2011.

S.-K. Hsien, B.-W. Chen, and G.-K. Ma, "A 6-bit, 1.2-gs/s dual channel adc in 0.13_m cmos for mb-ofdm uwb receivers," in *2008 IEEE International Conference on Ultra-Wideband*, Sep. 2008.

M. Strackx, E. D'Agostino, P. Leroux, and P. Reynaert, "Direct rf subsampling receivers enabling impulse-based uwb signals for breast cancer detection," *IEEE Transactions on Circuits and Systems II: Ex-press Briefs*, Feb. 2015.

\* cited by examiner

IMPULSE SAMPLER ARCHITECTURE AND ACTIVE CLOCK CANCELLATION ARCHITECTURE

RELATED APPLICATIONS

This application claims the benefit of U.S. Provisional Patent Application No. 62/299,675 filed on Feb. 25, 2016, which is incorporated herein by reference.

FIELD OF THE INVENTION

This invention relates to impulse sampler and active clock cancellation architectures.

BACKGROUND OF INVENTION

In the last few years, there has seen a shift from continuous-wave systems to pulse-based systems for high-resolution 3D imaging, high-speed wireless communication, and broadband spectroscopy. Designing a receiver to detect sub-100 psec pulses without causing distortion is extremely challenging. This requires a high-performance analog to digital converter (ADC) with an extremely short sampling window. Such samplers primarily exist in expensive III-V materials. Moreover, the ADC architectures have not changed in decades. Every year, the performance of ADCs has been improved by either moving to a newer technology node or by adding circuitry, such as bootstrapping or active cancellation. Such addition comes at a cost of increased area, power, or both. A novel Nonlinear Impulse Sampler architecture is introduced that aims to reduce the sampling window and increase the bandwidth of the system.

Conventional ADCs use Sample and Hold (S/H) or Track and Hold (T/H) architecture to sample the input signal. For example, a series CMOS switches sample the input signal and stores it on a holding capacitor. In these samplers, the series resistance of the CMOS switch (Rswitch) and the size of the holding cap (Chold) determine the time constant of the circuit ($\tau$=Rswitch×Chold) and its effective analog bandwidth. The analog bandwidth of these samplers is limited to 70 GHz. Such architectures are very useful in implementing an ADC with high linearity and resolution. However, these samplers operate at few gigahertz and thus have a relatively large sampling window compared to the proposed architecture. Moreover, to further reduce the sampling window, a high-speed clock with very sharp edges is required. The generation of such a clock with stringent requirement is extremely difficult and consumes large amount of power.

The proposed impulse sampler architecture uses ultra-short impulses to sample the signal. These short pulses activate a nonlinear sampling circuit for only a few picoseconds. One point of novelty of this architecture lies in the on-chip generation of the ultra-short impulse samplers, thus relinquishing the stringent external clock requirements. These improved samplers may significantly reduce the sampling window and increase bandwidth of a system.

SUMMARY OF INVENTION

In one embodiment, an impulse sampler comprises three main blocks: clock sharpening circuit, sampling stage, and post-sampling block. The clock sharpening circuit provides a clock signal and may include a differential amplifier followed by a voltage follower, which also acts as a voltage shifter. This block sharpens the incoming clock while acting as a buffer. The sharpened clock is fed to the input of the impulse sampling block. The impulse sampling block has two main transistors: impulse transistor M1 to generate the impulse, and sampling transistor M2 to sample the input signal. The collector of transistor M1 is connected to a voltage and its emitter connected to ground via a transmission line (T1), which acts as an inductor. Sampling transistor (M2) is used to sample the input signal. The emitter of this transistor is connected to the emitter of M1. Post-sampling block processes the sampled signal and acts as a sample and hold circuit. The first stage of the post-sampling block is a buffer that acts a voltage shifter. Following this stage is a class-A amplifier that inverts the signal.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1A:
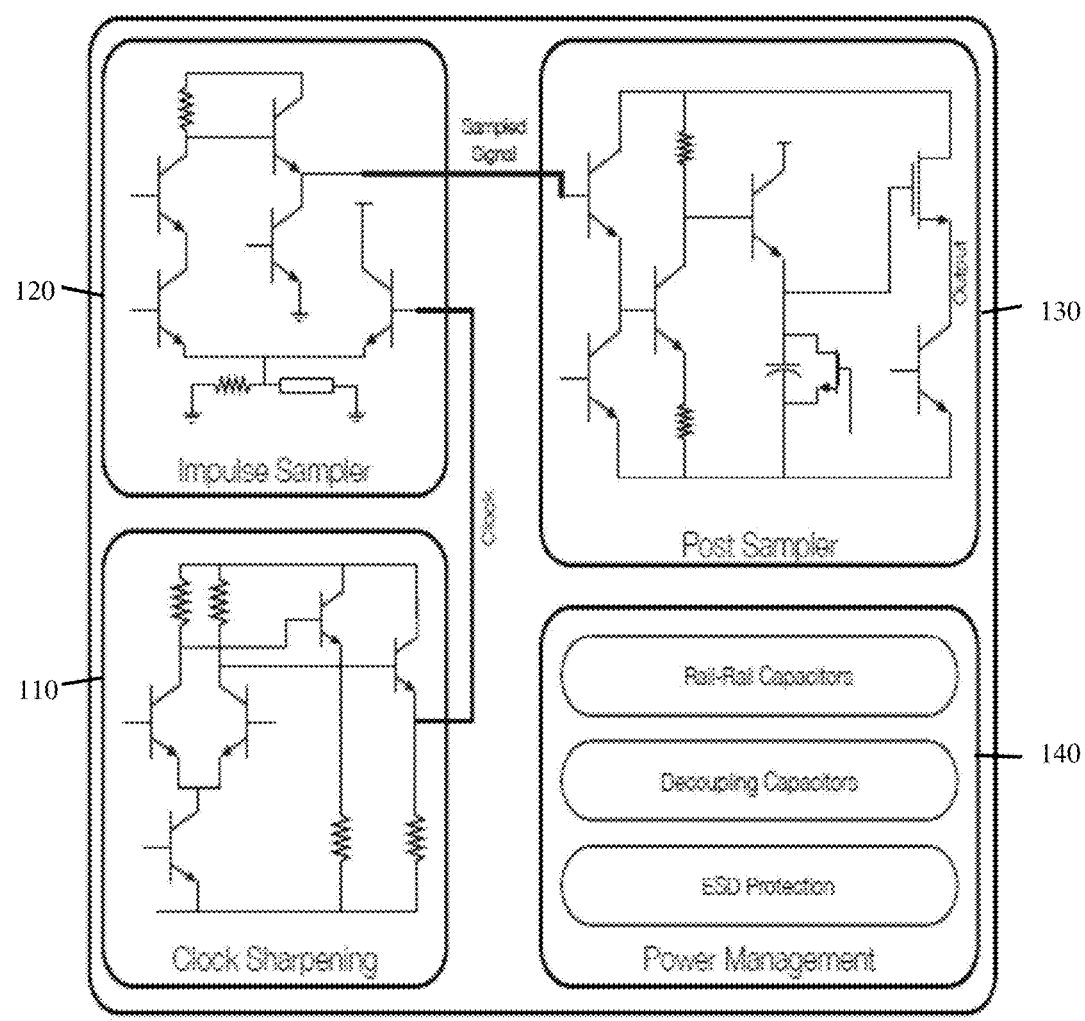
FIGS. 1A-1C respectively shows architecture and schematics for core blocks of an impulse sampler, including (1A) block diagram, (1B) impulse sampler, and (1C) post sampling.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

There has been growing interest in pulse-based system for imaging, high-speed wireless communication, or spectroscopy. Conventional samplers have a relatively large sampling window, which may be determined by the series resistance and size of the holding capacitor. Further, providing a high speed clock with sharp edges is difficult and consumes a large amount of power.

Improved impulse sampler systems and methods are discussed herein. In some embodiments, the impulse sampler systems and methods may be utilized in a wireless receiver receiving pulse signals. In some embodiments, the impulse sampler systems and methods may be utilized in an analog-to-digital converter (ADC) of the wireless receiver. The schematic of an improved sampler is explained herein. The impulse sampler comprises three main blocks, clock sharpening circuit 110, sampling stage 120, and post-sampling block 130, as shown in FIG. 1a. The clock sharpening circuit provides a very high gain differential amplifier followed by a voltage follower, which also acts as a voltage shifter. This block sharpens the incoming clock while acting as a buffer. The sharpened clock is fed to the input of the nonlinear impulse sampling block. The impulse sampler may also include a power management block 140, which may include any power management components desired, such as, but nonlimited to, rail-rail capacitors, decoupling capacitors, ESD protection, or combinations thereof.

Figure 1B:
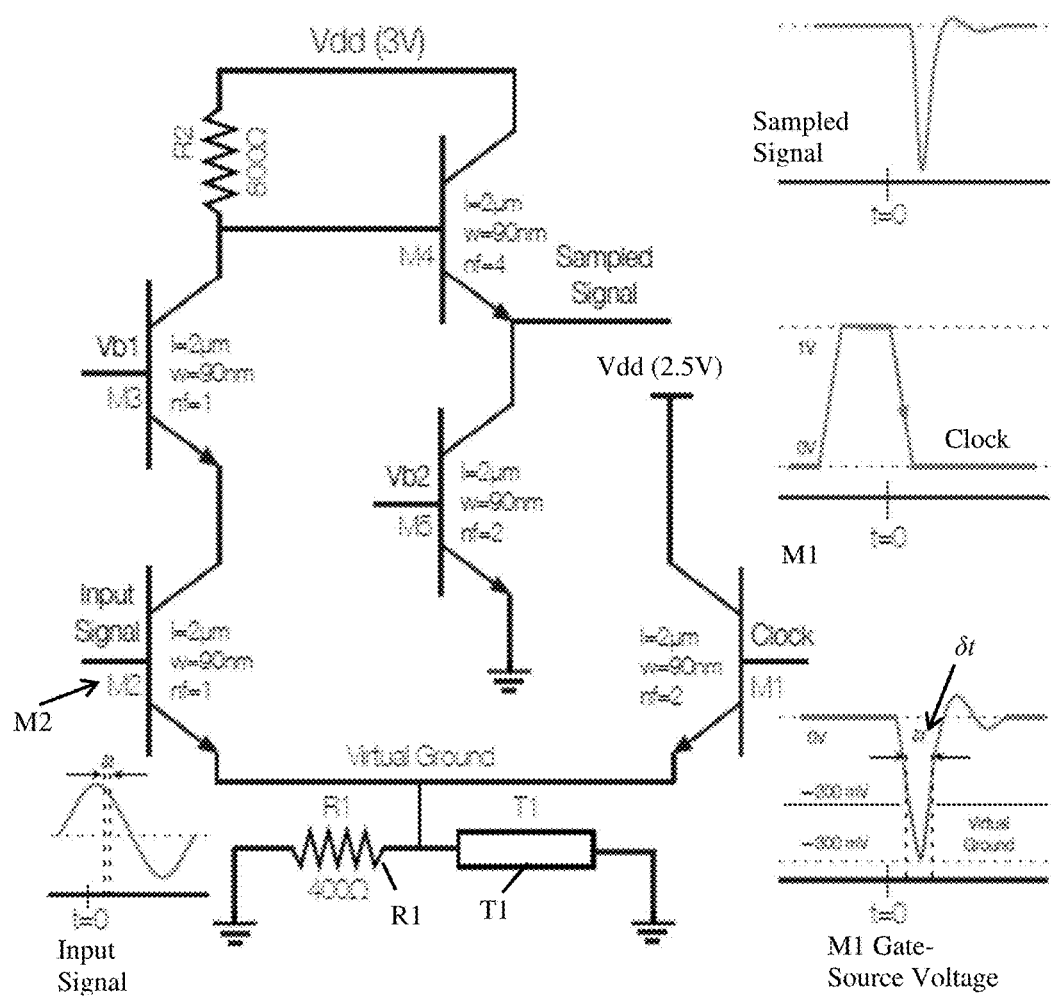

The nonlinear impulse sampling block has two main transistors, as shown in FIG. 1b. Impulse transistor M1 generates the impulse, and sampling transistor M2 samples the input signal. While various values are shown for the components in FIG. 1b, it shall be understood that the figure is a nonlimiting embodiment and such values are merely nonlimiting examples. As shown in FIG. 1b, the collector of transistor M1 is connected to Vdd and its emitter is connected to ground via a transmission line (T1). A clock signal is provided to the impulse sampling block, which may be provided to the impulse sampling block by the clock sharpening circuit. It is well understood in the art that a clock signal provides a signal that oscillates between low and high states. The impulse sampling block may provide a sampling circuit and coupling circuit. Regarding the coupling circuit, when the clock signal is high (e.g. 1V), transistor M1 is on and conducts current though transmission line T1. This transmission line T1 acts as an inductor. Soon after the clock becomes high, a steady state is reached and the voltage at emitter of M1 becomes close to ground (0V). At t=0, the clock starts to fall and reduces the first emitter voltage $V_{be}$ of M1, which in turn reduces the current through M1. The transmission line inductance opposes this change by lowering the emitter voltage of M1 below 0V in a very short time. For a short clock fall time, the current though M1 decreases quickly. This sharp drop in current generates a negative spike for few a picoseconds. In some embodiments, the impulse sampling block is suitable for impulse of 100 ps or shorter. In some embodiments, the impulse sampling block is suitable for impulse of 50 ps or shorter. In some embodiments, the impulse sampling block is suitable for impulse of 10 ps or shorter. This drop is proportional to the inductance of the transmission line and the rate of change in the current. The negative impulse voltage can be calculated by $$V_{impulse} = -L\frac{dI}{dt}.$$

A de-Qing resistor R1 is added to damp out the ringing in the impulse generated.

The sampling circuit provides a sampling transistor (M2) is used to sample the input signal. The emitter of this transistor M2 is connected to the emitter of M1. The input signal is biased such that M2 is off when its emitter is at 0V; hence no current flows through M2. When the impulse transistor M1 creates a negative impulse at the emitter node as discussed above, second emitter voltage $V_{be}$ of M2 increases and turns on M2 ($V_{be}=V_{InputSignal}-V_{Emitter}$). During this period, the current though M2 is exponentially proportional to the input signal. The output of the sampler is an impulse whose amplitude increases by the voltage of the input signal at the time of sampling. It shall be recognized by one of ordinary skill in the art that the sample signal outputted by M2 also has a short duration corresponding to the duration of the negative impulse. A voltage follower or buffer may be added as a buffer stage to decouple the sampler from the following stage. Transistor M3 is used as a cascode transistor of a M2-M3 cascode configuration to isolate resistor R2 and transistor M4 from M2 and eliminate the Miller effect.

In this architecture the sampling window is defined as the time during which the sampling transistor M2 turns on. In some embodiments, the sampling is suitable for impulse of 100 ps or shorter. In some embodiments, the impulse sampling block is suitable for impulse of 50 ps or shorter. In some embodiments, the impulse sampling block is suitable for impulse of 10 ps or shorter. This time is determined by the pulse width of the negative impulse and bias of the input signal. The sampling window of the sampler can be reduced by decreasing the bias voltage at the base of M2. The bias voltage can be chosen such that transistor M2 turns on for a few picoseconds. As shown nonlimiting example in FIG. 1b, the negative impulse generated by M1 has an amplitude of 300 mV. If we assume M2 turns on at a second emitter voltage of $V_{be}$ of 700 mV and input bias of 500 mV, the impulse sampler only turns on for a short period δt when the amplitude of the impulse is higher than 200 mV.

Figure 1C:
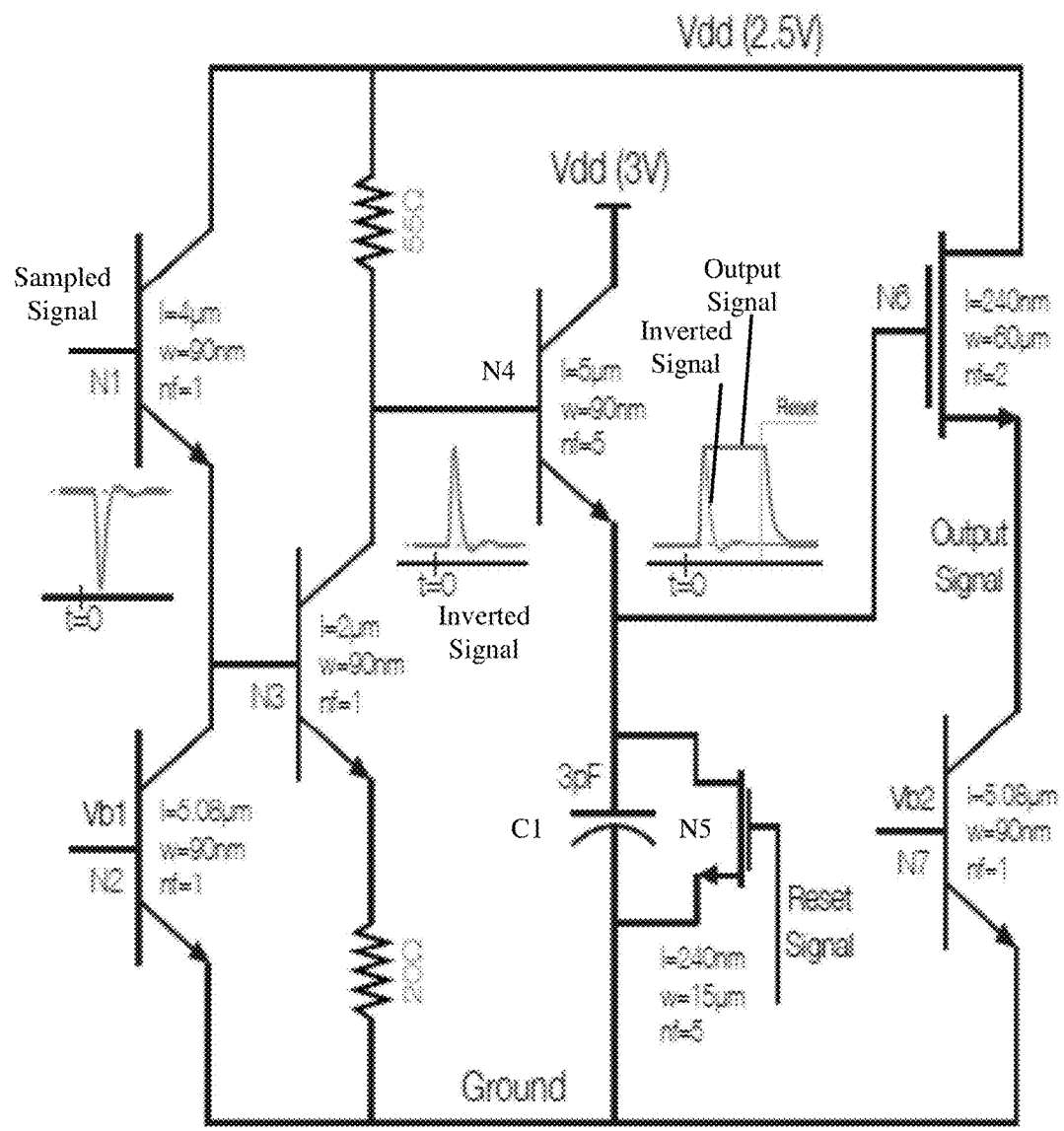

Post-sampling block processes the sampled signal and acts as a sample and hold circuit. The first stage of the post-sampling block is a buffer that acts a voltage shifter. Transistor N1 is used as a buffer to couple the sampled signal to transistor N3. Transistors N1 and N2 form an emitter follower circuit with emitter degeneration, where emitter load is transistor N2. Transistor N3 is an emitter amplifier with emitter degeneration to improve linearity. Following this stage is a class-A amplifier that inverts the signal, as shown by the input to transistor N4. The inverted signal is still an impulse, and its amplitude depends on the input signal. The following stage is a modified voltage follower stage, where instead of drain resistance, a holding capacitor C1 is added as shown in FIG. 1c. During the rising edge of the inverted signal impulse at the base of transistor N4, the voltage across the holding capacitor C1 follows the rising edge. However, during the falling edge of the inverted signal impulse, transistor N4 turns off and the holding capacitor C1 holds its voltage. This design enables the holding capacitor to retain the peak value of the impulse as shown by the output signal of transistor N4. This holding architecture gives enough settling time for the digitizer to digitize the held voltage. A reset transistor N5 is added across the holding capacitor C1 to reset its value before the next sample is acquired. Finally, an output buffer is added to read the voltage of the holding or sampling capacitor and drive a 50Ω load.

Figure 2:
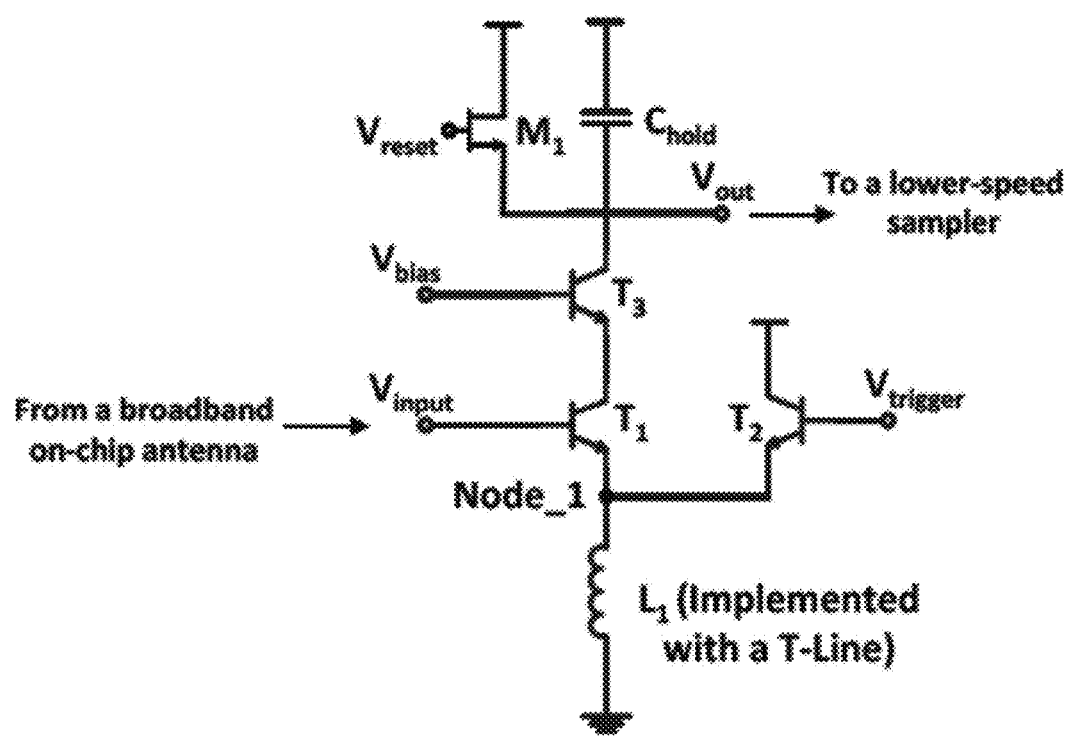
FIG. 2 shows an illustrative embodiment of an impulse sampler.

The novel technique used to sample the input signal is described in further detail herein (FIG. 2 providing a simplified illustration of an impulse sampler). In this technique, the input signal (Vinput), such as from a broadband on-chip antenna, is applied to the base node of a bipolar transistor T1 (e.g. high-speed bipolar transistor), as shown in FIG. 2. Initially, the $V_{be}$ of transistor T1 will remain slightly smaller than its threshold voltage, $V_{th}$. During this time, transistor T2 will be on, and its emitter current will flow through a small inductor L1. In some embodiments, L1 may be implemented with a short transmission line.

During the sampling phase, a fast trigger or clock signal (Vtrigger), with a fall time of 8 psec or shorter, will turn off T2 and force its current, I0, to become zero. This event will cause a sharp change in the current of L1, which will generate an ultra-short negative impulse at Node_1. The impulse will appear because inductor L1 will react to the change in its current by producing a sharp negative voltage at Node_1. On the basis of simulation results, it is expected that the short negative impulse will turn on transistor T1 for a short time, e.g. ~2 psec. During this period, transistor T1 will generate a short impulse current, e.g. with FWHM of 1 psec. The amplitude of this current will depend on the input voltage applied to base node of transistor T1. This current will flow through a cascade transistor T3 and generate a voltage on the holding capacitor $C_{hold}$. After this step, the voltage of the capacitor $C_{hold}$ will be captured and digitized. The cascode transistor T3 will eliminate the miller effect at the input node. A reset transistor M1 may be provided across the holding capacitor $C_{hold}$ to reset its value before the next sample is acquired. The relationship between the input voltage and the sampled output will be nonlinear, but it can be calibrated because it's systematic.

A comprehensive simulation incorporating the effect of parasitic RLC suggests that this method can sample pulses as short as 1 psec with four-bit accuracy, which suggests the sampler can reliably detect pulses of 100 psec or less. In other embodiments, the system may be capable of detecting pulses of 50 psec or less. In other embodiments, the system may be capable of detecting pulse of 10 psec or less. Based on the time-domain simulations performed, it's believed that it is possible to capture picosecond pulses with an optimized slot-bowtie antenna.

Figure 3:
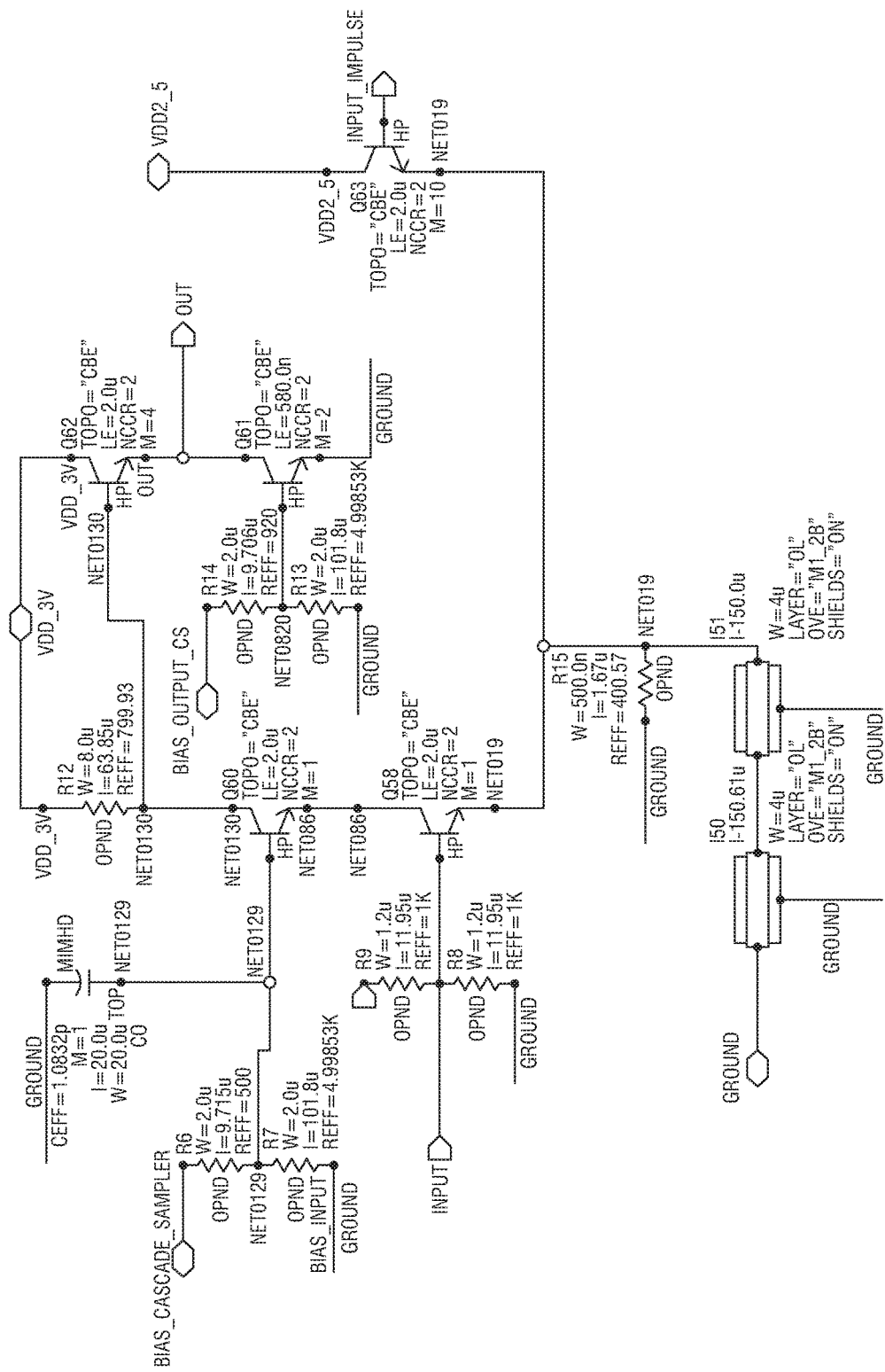
FIG. 3 shows an illustrative architecture of an impulse sampler.

Architecture:

The new architecture for sampler is discussed (FIG. 3). The architecture uses impulses to sample the input signal. The impulse switches the base of the transistor which samples the signal.

A fast clock (e.g. 10 GHz or faster) is provided which goes through a clock sharpening circuit, which can be a digital buffer. This circuit sharpens the incoming clock by decreasing the rise/fall time of the clock transitions. The clock is the then fed to the sampling block.

In the sampling block, the clock switches the base of an impulse transistor whose emitter is connected to an inductor, when the clock switches the impulse transistor on, a large amount of current flows through the impulse transistor to the inductor. The inductor stores this energy until the clock switches off the impulse transistor. This sudden transition causes the inductor to release the stored energy in a form of impulse. A matching network along with filters can be used to make the impulse sharp and ringing free. This impulse drives the emitter of the sampling transistor.

The sampling transistor's base is fed with the signal to be sampled. The input signal is biased in such a way that the sampling transistor is in off stage until the impulse generated by the inductor arrives and turns into a high gain amplifier. Cascade structure is used to increase the instantaneous gain of the sampler. The voltage in the sampler is proportional to the input signal and the duration of the impulse. Further signal conditioning is done to convert the impulse to an amplitude modulated step response.

Clock Leakage Mitigation Architecture for Sampling Transmission-Gate:

In addition to mitigating the source-drain leakage in a sampling transmission-gate using active cancellation, it is very important to mitigate the sampling clock leakage in high-speed sampling circuits. To mitigate clock leakage, extra transistors are added to the existing transmission-gate with active cancellation architecture. These extra transistors are added in such a way that when fed with the sampling clock and its complementary signal, the gate-source and gate-drain leakages are mitigated. The added clock leakage mitigation circuit on top of source-drain leakage mitigation circuit makes the complete system behave like an ideal transmission gate, even at very high sampling clock and input frequencies. This close to ideal transmission-gate helps in improving the performance number of the sampler. A nonlimiting example of a suitable clock leakage mitigation architecture is provided in U.S. Pat. No. 9,246,505, which is incorporated by reference herein.

Experimental Example

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

Figure 4:
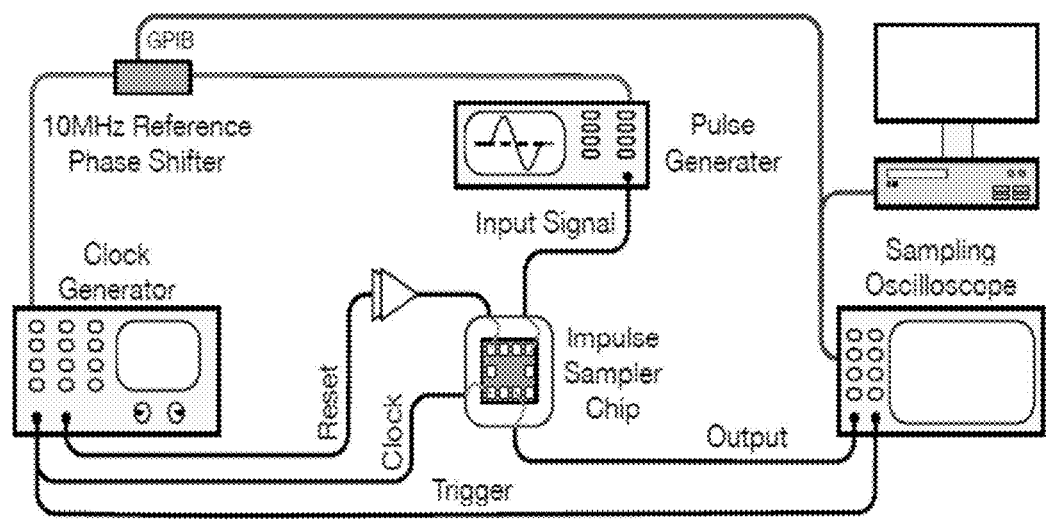
FIG. 4 shows an experimental setup.

Measurement Setup:

FIG. 4 shows an experimental setup. The measurement setup includes a two-channel arbitrary waveform generator that generates the clock and the reset signals both at 200 MHz. The reset signal has a one-third duty cycle and is shifted to arrive during the period when a DC current flows through T1 (end of hold phase). Both clock and reset signals are internally locked. An external RF signal generator is used to generate a high-frequency tone as the input signal for the SFDR measurement. The waveform generator and RF generator are locked using a 10 MHz reference clock. In a separate measurement, instead of using an RF generator, a keysight M8195A 65 GS/s arbitrary waveform generator is used to generate an extremely short impulse with a 100 psec pulse width.

A 10 MHz analog phase shifter is added on the reference clock path to shift the relative positioning of the sampling clock and the input signal. The phase shifter linearly shifts the 10 MHz clock up to 360° by adjusting its control voltage. The 10 MHz reference clock is upconverted to 200 MHz (×20) to generate a clock. To emulate a sub-sampling ADC, the voltage across the phase shifter is continuously shifted to change the sampling position. In this setup, the voltage across the phase-shifter can be varied with an accuracy of 0.2 mV, which corresponds to 1.67 ps in the time domain. The output of the impulse sampler chip is digitized by a Keysight sampling oscilloscope. The entire acquisition process is automated using a Matlab code. A master computer communicates with the instrument using a GPIB-VISA protocol.

Figure 5:
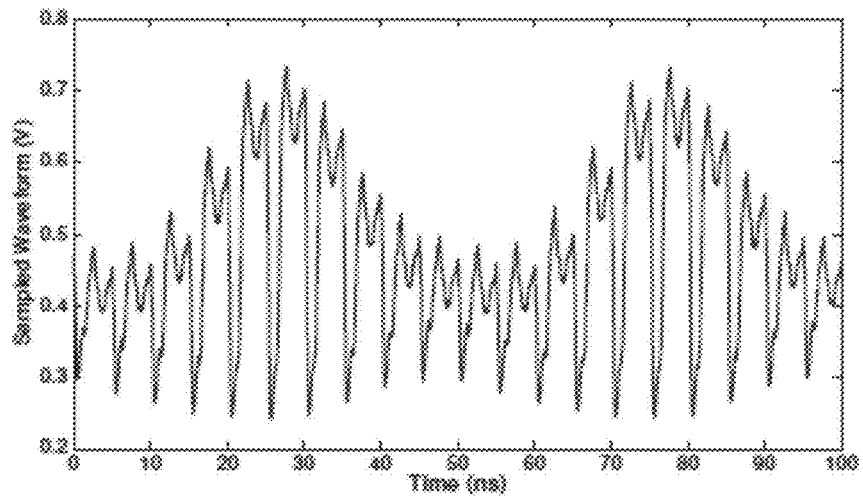
FIG. 5 shows a 20 MHz input signal sampled at 200 MHz.
Figure 6:
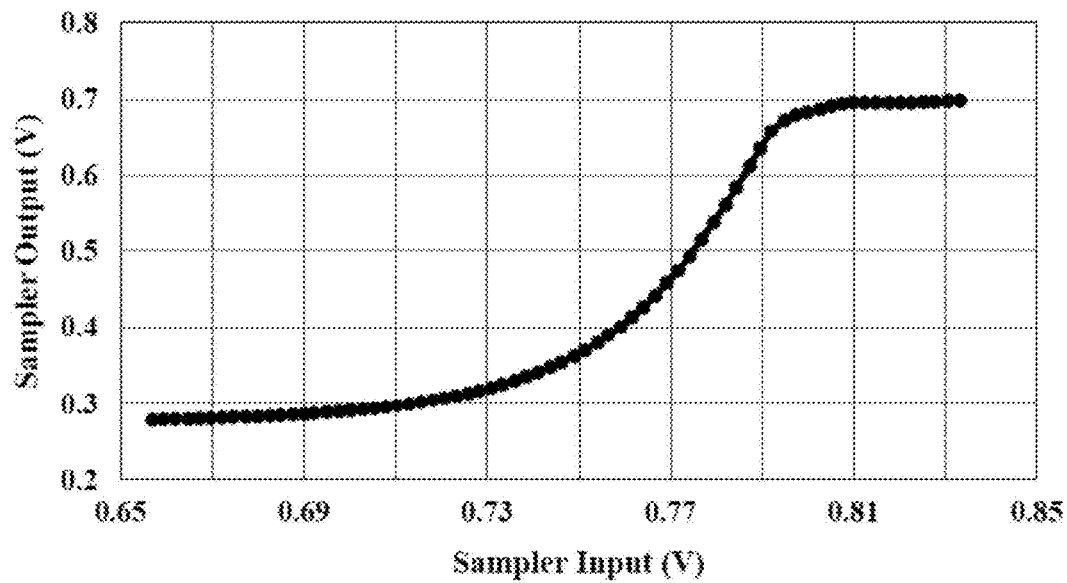
FIG. 6 shows sampled output voltage versus input DC voltage.

Measurement Results:

The performance of the chip is shown with various different experiments. FIG. 5 shows a 20 MHz input signal sampled at 200 MHz. First, to determine the voltage characteristics of the impulse sampler, the DC of the input signal was swept, and the sampled output was measured. As expected, the output signal increases exponentially before saturating the sampling transistor, as shown in FIG. 6. This measurement is crucial in determining the input-output transfer function of the sampler chip. The input signal can be recovered by reverse mapping the sampled output with this one-to-one transfer function.

Figure 7:
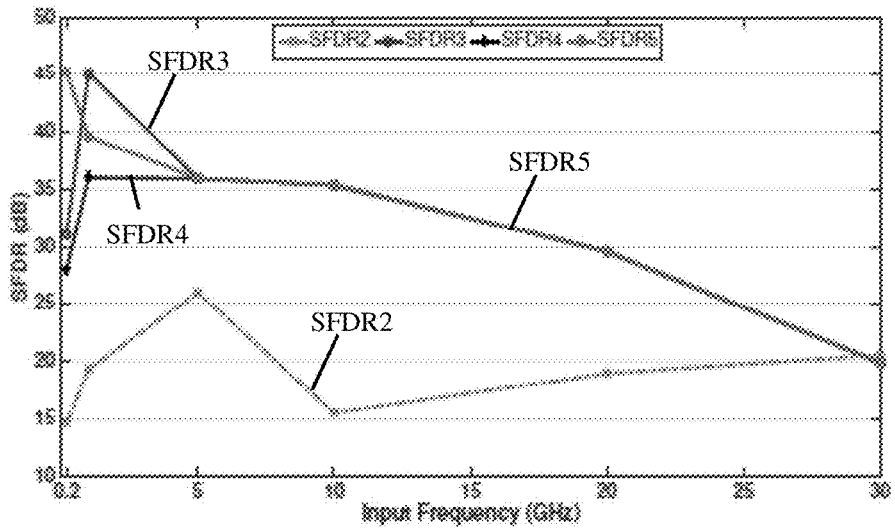
FIG. 7 shows SFDR of recovered signal from impulse sampler.

Another experiment performed was to determine the linearity and bandwidth of the impulse sampler. To perform this experiment, the input signal is swept from 200 MHz to 30 GHz while keeping the peak-to-peak voltage constant at 80 mV. The phase shifter voltage is linearly increased after every sampling to achieve 128 samples during one period of the input signal. The output value is averaged 16 times before a 256 point DFT is performed. Even though the sampler is differential, the current measurements are done single ended. Finally, the SFDR values at different input frequencies are reported in FIG. 7. Based on the measurement results, SFDR3, SFDR4, and SFDR5 converge after the input frequency reaches 5 GHz. This is because the harmonics fall below the noise floor.

Figure 8:
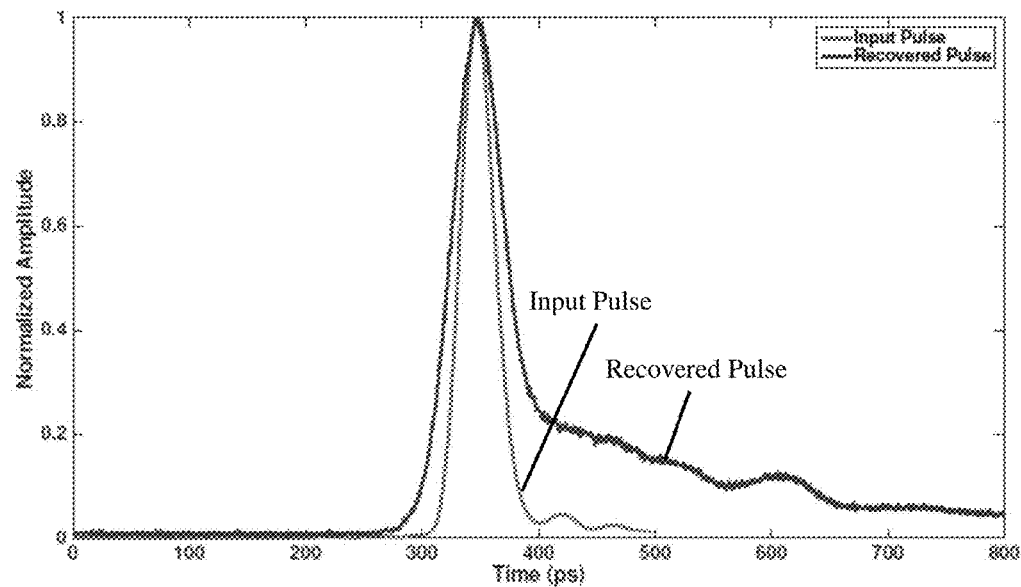
FIG. 8 shows pulse recovered from impulse sampler.

In the second experiment, a pulse with Full-Width-at-Half-Maximum (FWHM) of 35 ps was generated using an arbitrary waveform generator and fed to the input of the sampler chip. The input and sampled output are normalized and then plotted for comparison. As shown in FIG. 8, the pulse recovered from the impulse sampler is very close to the input signal. The recovered pulse has a FWHM of 53 ps. An accurate recovery of the pulse is essential in spectroscopy and medical imaging. The close numbers show that the sampling window of the impulse sampler is very small and the system is extremely broadband. This experiment demonstrates the ability to detect ultrashort pulses.

Figure 9:
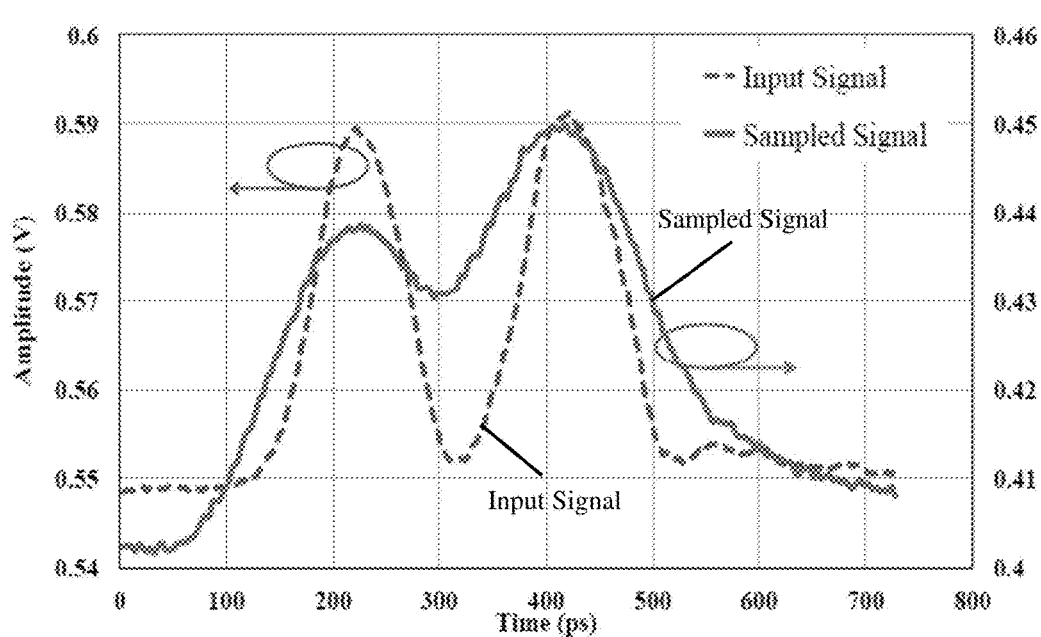
FIG. 9 shows amplitude (V) versus time (ps) for an input signal and sampled signal.
Figures 10A, 10B:
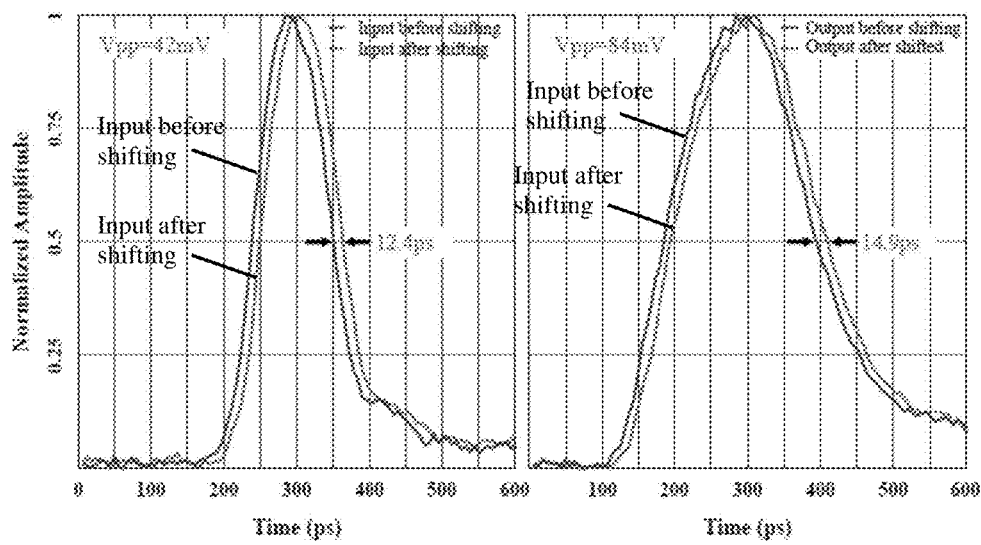
FIGS. 10A-10B respectively show normalized amplitude versus time (ps) for input and output before/after shifting.

The third experiment shows the ability to distinguish very short pulses next to each other. This parameter is important in communication & imaging applications and sets the limit for data-rate and spatial resolution. As illustrated in FIG. 9, the chip can easily detect two pulses (FWHM=93 ps) that are 200 ps apart. Finally, FIGS. 10A-10B show the ability to detect very small shifts in the position of the pulses. In this experiment, the input pulse is shifted by 12.4 ps (measured at 50% amplitude), the sampled pulse shifts by 14.9 ps (also measured at 50% amplitude). This shows that the sampler can detect shifts with an accuracy better than 3 ps, which corresponds to 1 mm in air, a critical parameter for building impulse radar. The performance of this chip is compared with other devices in Table I.

TABLE I

Performance Comparison of UWB Impulse Samplers in Silicon

| | This Work | RFIC 14 [8] | RFIT 16 [9] | RFIT 11 [10] | ICUWB 08 [11] |
|---|---|---|---|---|---|
| Detection Method | Impulse Sub-sampling | Track/Hold Sub-sampling | Pipelined Flash | Flash Sub-sampling | Track/Hold Sampling |
| Input Signal (Max) | 35 ps (FWHM) | CF: 4.5 GHz BW: 1.5 GHz | 2.5 GHz | 4.3 GHz | 550 MHz |
| Signal Type | Gaussian Pulse | Gaussian Pulse | Continious Wave | Continious Wave | Continious Wave |
| Bandwith | >10 GHz | 10 GHz | 2.5 GHz | 4.3 GHz | 550 MHz |
| Sampling Rate | >500 MHz | 100 MHz | 5 GHz | 4.25 GHz | 1.2 GHz |
| Lowest Power Detected | −15 dBm | −15 dBm* | Not Reported | Not Reported | Not Reported |
| Signal Type | Single-ended | Differential | Single-ended | Differential | Differential |
| Technology | 90 nm BiCMOS | 40 nm CMOS | 65 nm CMOS | 130 nm CMOS | 130 nm CMOS |
| Die Area | 1.02 mm$^2$ (Including pads) | 1.09 mm$^2$ (Including pads) | 1.1 mm$^2$ (core) | 0.35 mm$^2$ (Without pads) | 1.13 mm$^2$ (Active Area) |
| Power Consumption | 105 mW (Total) | 1.4 mW (Core only) | 13.4 mW (Total) | 63 mW (Without buffers) | 84 mW |

[RFIC 14: M. Strackx, E. D'Agostino, P. Leroux, and P. Reynaert, "A 6-b uwb subsampling track amp; hold with 5.5-ghz erbw in 40 nm cmos," in 2014 *IEEE Radio Frequency Integrated Circuits Symposium*, June 2014; RFIT 16: X. Liu, S. Ma, M. Yan, J. Ren, and H. Yu, "A 5-gs/s, 13-mw, 2-channel time-interleaved asynchronous adc in 65 nm cmos," in 2016 *IEEE International Symposium on Radio-Frequency Integration Technology* (RFIT), August 2016; RFIT 11: Z. Yi, W. Shenjie, H. Zhiliang, and Z. Zaichen, "A sub-sampling 4.25 gs/s 3-bit flash adc with asymmetric spatial filter response," in 2011 *IEEE International Symposium on Radio-Frequency Integration Technology*, November 2011.); and ICUWB 08: S.-K. Hsien, B.-W. Chen, and G.-K. Ma, "A 6-bit, 1.2-gs/s dual channel adc in 0.13 μm cmos for mb-ofdm uwb receivers," in 2008 *IEEE International Conference on Ultra-Wideband*, September 2008.]

Figure 11:
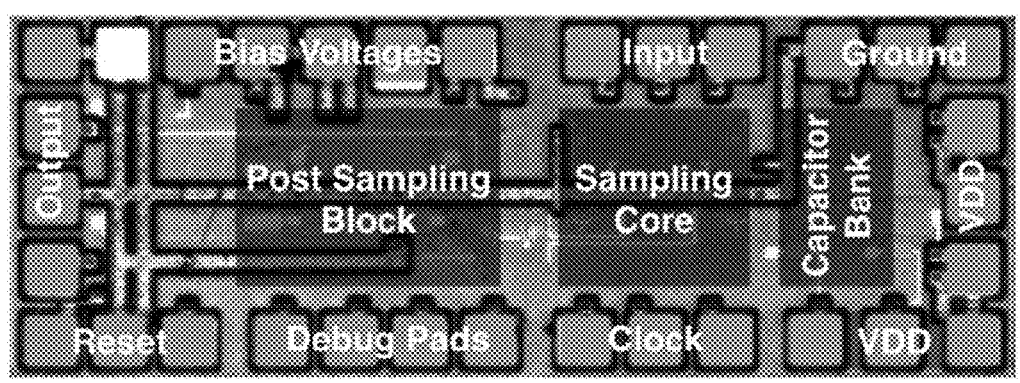
FIG. 11 shows a chip micrograph of impulse sampler fabricated in IBM9HP BiCMOS process and measures 1.7 mm×0.6 mm including bondpads.

The chip is fabricated in IBM9HP BiCMOS process measuring 1.7 mm×0.6 mm, including bondpads. The active core area measures 210 μm×320 μm. The chip requires two voltage levels +3V +2.5V and consumes 105 mW of total power. The chip micrograph is shown in FIG. 11.

The novel nonlinear impulse sampler architecture uses ultra-short impulses generated on-chip to turn on the sampling circuit for a very short period of time, during which the sampler samples the input signal. A post-sampler circuit is designed to hold the sampled values. Finally, it is shown that the sampler can detect pulses as short as 100 psec or less.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. A method for sampling an input signal, the method comprising:
   providing a clock signal to a coupling circuit;
   receiving an input signal with a sampling transistor, where the sampling transistor provides
      a first base receiving the input signal, and
      a first emitter coupled to receive the clock signal from the coupling circuit; and
   receiving the clock signal at an impulse transistor of the coupling circuit, wherein the impulse transistor provides
      a second base receiving the clock signal,
      a second collector connected to a voltage, and
      a second emitter of the impulse transistor coupled to ground.

2. The method of claim 1, wherein an inductor or a transmission line is used to couple the second emitter of the impulse transistor to ground.

3. The method of claim 1, wherein after the clock signal enters a high state, a second emitter voltage of the first emitter approaches a steady state of 0V, and
   when the clock signal subsequently falls to a low state, the second emitter voltage provides a negative impulse.

4. The method of claim 3, wherein the negative impulse from the second emitter causes the sampling transistor to turn on dining the negative impulse and output a sampled signal.

5. The method of claim 4, wherein the sampled signal is provided to a voltage follower or buffer to decouple the sampled signal from a following stage.

6. The method of claim 4 further comprising:
   receiving the sampled signal at a post-sampling block;
   inverting the sampled signal to create an inverted signal; and
   generating an output signal with a sample and hold circuit, wherein the output signal rising to a high hold state when the inverted signal rises, and the output signal is held at the high hold state for a period of time sufficient to digitize.

7. The method of claim 6, wherein the post-sampling block provides a buffer acting as a voltage shifter.

8. The method of claim 6 further comprising the step of buffering the sampled signal received by the post-sampling block prior to the inverting step.

9. The method of claim 3, wherein the negative impulse has a duration of 100 picoseconds or less.

10. The method of claim 1, wherein the input signal provided to the sampling transistor is biased to cause the sampling transistor to be off when a first emitter voltage of the first emitter is 0V.

11. The method of claim 1, wherein a fall time of the clock signal is 8 psec or shorter.

12. An impulse sampler comprising:
   a coupling circuit receiving a clock signal; and
   a sampling transistor receiving an input signal, wherein the sampling transistor comprises
      a first base of the sampling transistor receiving the input signal, and
      a first emitter of the sampling transistor coupled to receive the clock signal from the coupling circuit; and
   an impulse transistor of the coupling circuit, wherein the impulse transistor comprises
      a second base of the impulse transistor receiving the clock signal,
      a second collector of the impulse transistor connected to a voltage, and
      a second emitter of the impulse transistor coupled to ground.

13. The impulse sampler of claim 12, further comprising an inductor or a transmission line coupling the second emitter of the impulse transistor to ground.

14. The impulse sampler of claim 12, wherein a second emitter voltage of the second emitter approaches a steady state of 0V after the clock signal enters a high state, and
   when the clock signal subsequently falls to a low state, the second emitter voltage provides a negative impulse.

15. The impulse sampler of claim 14, wherein the negative impulse from the second emitter causes the sampling transistor to turn on during the negative impulse and output a sampled signal.

16. The impulse sampler of claim 15 further comprising:
   a post-sampling block receiving the sampled signal;
   an amplifier for inverting the sampled signal to create an inverted signal, and
   a sample and hold circuit receiving the inverted signal and generating an output signal, wherein the output signal rises to a high hold state when the inverted signal rises, and the output signal is held at the high hold state for a period of time sufficient to digitize.

17. The impulse sampler of claim 16, wherein the post-sampling block provides a buffer acting as a voltage shifter.

18. The impulse sampler of claim 16 further comprising a buffer for receiving the sampled signal prior to the amplifier.

19. The impulse sampler of claim 14, wherein the sampled signal is provided to a voltage follower to buffer or decouple the impulse sampler from a following stage.

20. The method of claim 14, wherein the negative impulse has a duration of 100 picoseconds or less.

21. The impulse sampler of claim 12, wherein the input signal provided to the sampling transistor is biased to cause the sampling transistor to be off when a first emitter voltage of the first emitter is 0V.

22. The method of claim 12, wherein a fall time of the clock signal is 8 psec or shorter.

* * * * *